United States Patent [19]

Nishizawa et al.

[11] 4,400,710
[45] Aug. 23, 1983

[54] SEMICONDUCTOR DEVICE

[75] Inventors: Jun-ichi Nishizawa; Tadahiro Ohmi; Keishiro Takahashi, all of Sendai, Japan

[73] Assignee: Zaidan Hojin Handotai Kenkyu Shinkokai, Sendai, Japan

[21] Appl. No.: 210,531

[22] Filed: Nov. 25, 1980

[30] Foreign Application Priority Data

Nov. 26, 1979 [JP] Japan .................................. 54-153388

[51] Int. Cl.³ .................... H01L 29/48; H01L 29/74; H01L 29/80
[52] U.S. Cl. ............................................ 357/15; 12/22; 12/38
[58] Field of Search ...................... 357/12, 15, 22, 38

[56] References Cited

U.S. PATENT DOCUMENTS

| | | | |
|---|---|---|---|
| 4,216,029 | 8/1980 | Ohki | 357/22 |
| 4,223,328 | 9/1980 | Terasawa et al. | 357/22 |
| 4,317,127 | 2/1982 | Nishizawa | 357/22 |

*Primary Examiner*—James W. Davie
*Attorney, Agent, or Firm*—Cushman, Darby & Cushman

[57] ABSTRACT

A semiconductor device having its carrier-injecting region formed with a Schottky structure, and arranged so that the current flowing through the Schottky barrier by virtue of tunnel effect is controlled by a controlling electrode to thereby control the drain or collector or anode current. Thus, this device has a large current density and a large current gain. This device can be used not only as a discrete one, but also it is quite suitable when applied to integrated circuits.

27 Claims, 14 Drawing Figures

SEMICONDUCTOR DEVICE

BACKGROUND OF THE INVENTION

(a) Field of the Invention

The present invention relates to a semiconductor device having a carrier-injecting electrode of a Schottky structure, which operates under a new operating principle.

(b) Description of the Prior Art

Transistors which have been proposed in the past are represented mainly by the following three kinds. They are: bipolar transistor (hereinunder to be referred to as BPT), field effect transistor (hereinunder will be referred to as FET) and static induction transistor (hereinunder will be referred to as SIT). A BPT having a three-layer structure of either npn type or pnp type, controls its collector current by controlling the amount of injection of minority carriers which are injected into its base region from the emitter region. An FET is a majority-carrier type device designed to control its drain current by controlling the channel through which the majority carriers are allowed to flow. An SIT, on the other hand, is a device in which both the gate voltage and drain voltage, relative to source potential, influence the drain current value throughout a large range of voltage. The SIT is a device designed so that, in its main operative state, a potential barrier is produced in the vicinity of the source region or within the source region, and the amount of carriers flowing therethrough is controlled by the height of this potential barrier. In each of these three kinds of transistors the region from which carriers are injected, i.e. the source region or the emitter region, is formed with a semiconductor having a high impurity concentration.

SUMMARY OF THE INVENTION

It is a primary object of the present invention to provide a semiconductor device of the type wherein the region from which carriers are injected is formed with a Schottky structure so as to inject carriers into either the channel region or the base region by virtue of the so-called tunnel effect.

Another object of the present invention is to provide a semiconductor device of the type as described above, wherein the tunnel current due to said tunnel effect can be controlled by a voltage applied to a controlling electrode.

Still another object of the present invention is to provide a semiconductor device of the type described above, wherein the area of the channel region (or the base region) can be made small, yet wherein, in spite of the small area thereof, a large current is allowed to flow, i.e. the current density is made large, to enable a high-speed operation to be performed.

Yet another object of the present invention is to provide a semiconductor device of the type as described above which is arranged so that its current gain can be made large and that a large fan-out can be obtained.

A further object of the present invention is to provide a semiconductor device of the type as described above, which is suitable not only as a discrete device but also for the fabrication of an integrated circuit.

A still further object of the present invention is to provide a semiconductor device of the type as described above, which can be utilized not only as a transistor but also as a thyristor.

DETAILED DESCRIPTION OF THE PREFERRED EMBODIMENTS

Figure 1:
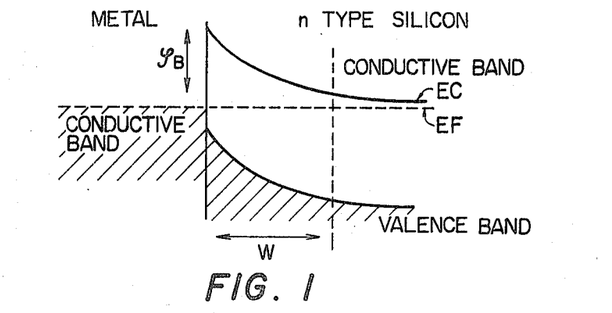
FIG. 1 is an explanatory illustration of the energy bands of Schottky junction.

FIG. 1 shows energy band structure wherein a metal is placed, in the form of Schottky junction, on an n type silicon wafer. Symbol $\phi_B$ represents the height of potential barrier, $E_C$ represents the energy of the conductive band edge as measured from the top of valence band, and $E_F$ represents the Fermi level. Symbol W represents the width of the region in the band where a curve is produced, i.e. the width of the space charge region. Let us here assume that the impurity concentration of the n type silicon is designated by $N_D$. Then, the width W of the space charge region is given by:

$$W = \left( \frac{2\epsilon(\phi_B - E_C + E_F)}{qN_D} \right)^{\frac{1}{2}}, \tag{1}$$

wherein:

q represents a unit electric charge; and $\epsilon$ represents a dielectric constant of silicon.

The value of the width W of the space charge region will be, for example, as follows.

| $N_D$ | $\phi_B - E_C + E_F$ | |
|---|---|---|
| | 0.7V | 0.5V |
| $1 \times 10^{14} \text{cm}^{-3}$ | 3.000 μm | 2.600 μm |
| $1 \times 10^{15} \text{cm}^{-3}$ | 0.960 μm | 0.810 μm |
| $1 \times 10^{16} \text{cm}^{-3}$ | 0.300 μm | 0.260 μm |
| $1 \times 10^{17} \text{cm}^{-3}$ | 0.096 μm | 0.081 μm |
| $1 \times 10^{18} \text{cm}^{-3}$ | 0.030 μm | 0.026 μm |

The formula (1) is one derived under the so-called abrupt approximation such that the transition from the depleted region to the neutral region takes the form of stepwise function. However, when consideration is directed to carrier distribution related to the temperature, the transition region from the perfectly depleted region to the neutral region may be considered as being about 4 to 5 times the Debye length $l_D$ which is expressed by the following formula:

$$l_D = \left( \frac{\epsilon kT}{N_D q^2} \right)$$

wherein:

k represents Boltzmann constant; and

T represents temperature.

Where the barrier height $\phi_B$ takes a value of about 0.3 V or higher, if a positive voltage is applied to the n type silicon side in FIG. 1, a reverse voltage is applied to the device, so that normally no current will flow. Where, however, the impurity concentration $N_D$ of the n type silicon is increased, causing a reduction in the width W of the space charge region to about several 100 Å or less, a current will begin to flow by virtue of a tunnel effect.

The transistor shown in the embodiments is arranged so that an above-described Schottky junction is provided on either the emitter (or source) side of a transistor, so as to be operative that, by a voltage applied to a control electode which serves as a base or a gate of the transistor, the width W of the space charge region (wherein the energy band is curved) is controlled to control the tunnel current, and, thus to control the collector or drain current.

Figure 2A:
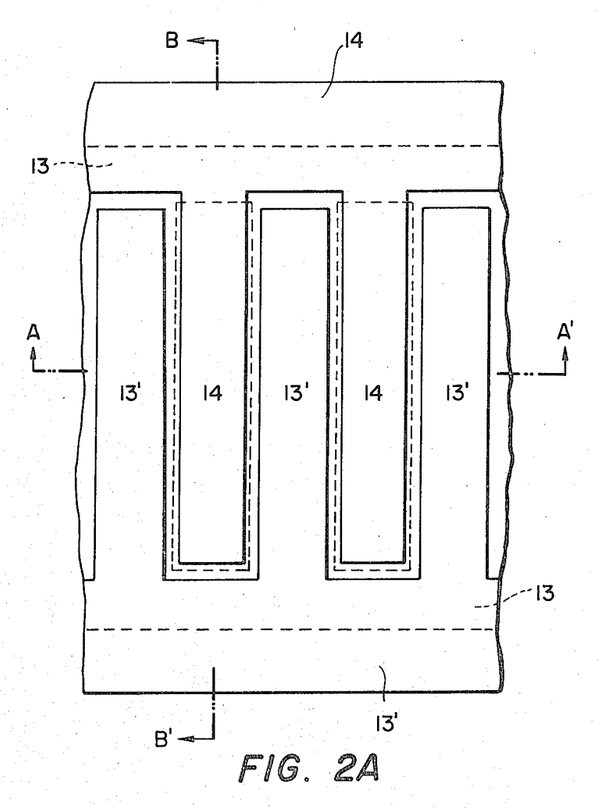
FIG. 2A is a diagrammatic plan view of an embodiment of the semiconductor device according to the present invention.
Figure 2B:
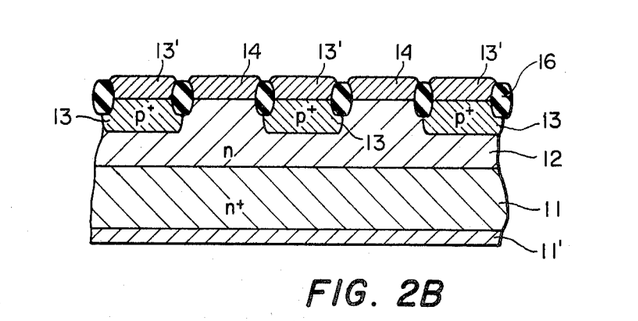
FIG. 2B is a diagrammatic sectional view taken along the line A—A' in FIG. 2A.
Figure 2C:
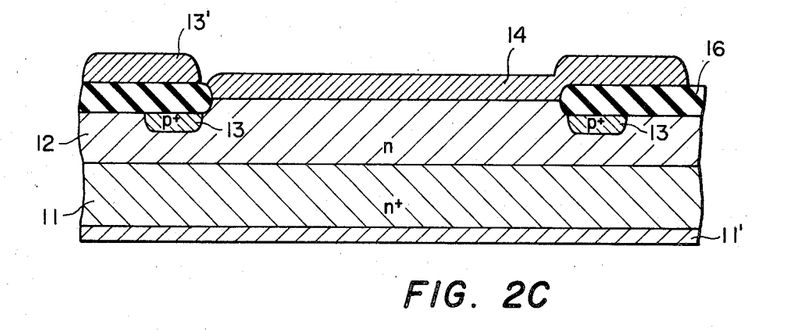
FIG. 2C is a diagrammatic sectional view taken along the line B—B' in FIG. 2A.

FIGS. 2A to 2C show the structure of an embodiment of a transistor according to the present invention. That portion of the transistor indicated by dotted line in FIG. 2A represents a p+ type region 13, whereas those portions indicated by a solid line represent electrodes 13' and 14, respectively. In FIG. 2B, and n+ type substrate 11 serves as a drain or a collector, an n type region 12 a channel region, and a p+ type region 13 a gate or a base lead-out region. Reference numeral 11' represents a drain electrode or a collector electrode, 13' represents a gate electrode, and 14 represents a source electrode or an emitter electrode. Reference numeral 16 represents an insulator region formed with a metal compound such as SiO₂, Si₃N₄, Al₂O₃, AlN or their composite insulator region. In this embodiment, the source electrode 14 and the gate electrode 13' are formed in an interdigital pattern as shown in FIG. 2A. Si is used usually as a semiconductor and, in some cases, elements such as Ge, GaAs and InP are used.

Said Schottky junction is formed at the junction between the source electrode 14 and the n type region 12. This junction is formed in a manner as follows. An n type silicon is used to provide an n type region 12. A metal layer selected from Pt, Ti, Ta, W, Mo and other metals is deposited on top of this n type region 12 by an evaporation-deposition technique. A Schottky junction is provided by metal-evaporation onto the semiconductor surface. In this structure, however, the interface between the metal and the semiconductor is usually difficult to keep clean. Therefore, in many cases, the resulting assembly is subjected to a heat treatment at a temperature of, for example, 700° C. to 200° C. so as to form a silicide such as PtSi₂, TiSi₂, TaSi₂, WSi₂, MoSi₂ and etc. between the electrode 14 and the n type region 12. Thus, the junction between said silicide and the n type region 12 is provided as a Schottky junction. If the impurity concentration in the semiconductor is set relatively low, at a value less than, for example, $1 \times 10^{17}$ cm⁻³ wherein, the width of the potential barrier is ketp at a value greater than a certain value to prevent an appreciable tunnel injection. This junction interface is extremely clean. For this reason, the surface recombination of holes on the n type region side is greatly reduced, causing the holes to be easily stored in the space charge region located just under the Schottky contact.

Figure 3A:
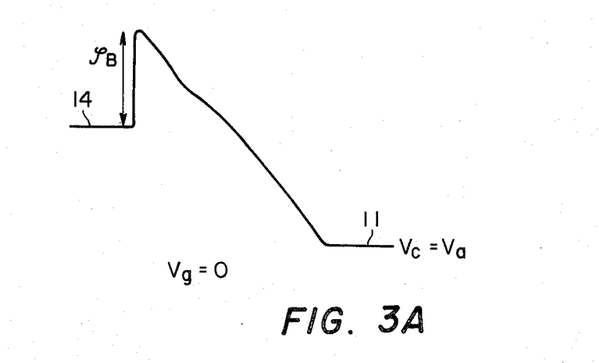
FIG. 3A is a chart of potential distribution between the source and drain regions along the central portion of the channel region in FIG. 2A when $V_g=0$.
Figure 3B:
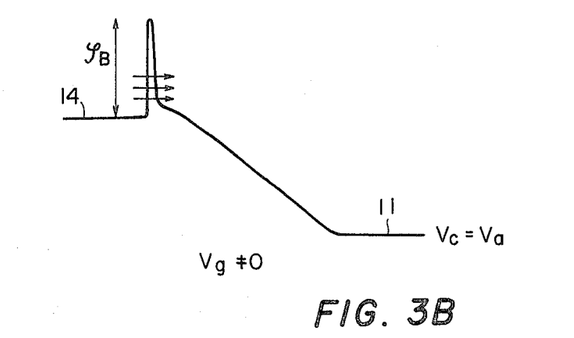
FIG. 3B is a chart of potential distribution between the source and drain regions along the central portion of the channel region in FIG. 2A when $V_g \neq 0$.

The operating principle of this embodiment of the transistor according to the present invention will be described by referring to FIGS. 3A and 3B. FIGS. 3A and 3B show potential distribution relative to electrons in the central portion of the n type region located between the respective gate regions 13 and 13 in FIG. 2A, i.e. along the central portion of the channel region 12. A required positive voltage $V_a$ is applied to the drain region 11, relative to the source electrode 14. FIG. 3A shows an instance wherein the gate voltage $V_g$ relative to the source electrode 14 is zero. Explanation will be made by picking up the potential distribution shown in FIG. 3A, though the potential distribution may vary depending on such factors as the structure of the gate region and the impurity concentration of the respective regions and also the distance between the source region and the drain region.

Figure 4A:
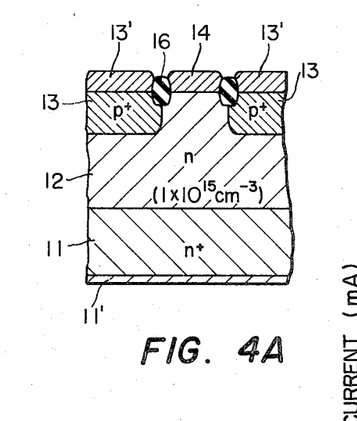
FIG. 4A is a diagrammatic sectional view of a semiconductor device having shallow gate regions but the distance therebetween is large.
Figure 4B:
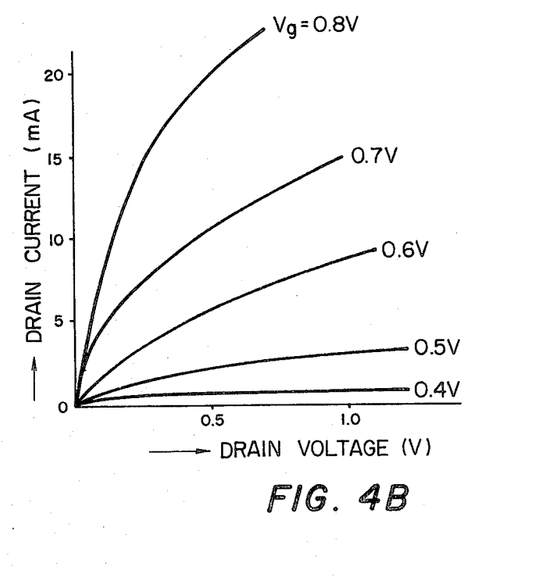
FIG. 4B is an I-V characteristic chart of the drain region in the structure shown in FIG. 4A.
Figure 5A:
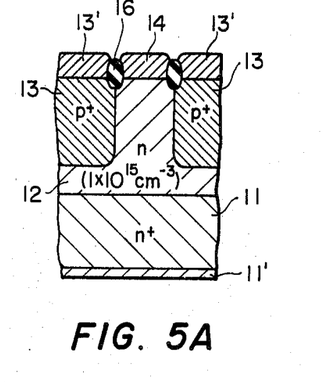
FIG. 5A is a diagrammatic sectional view of a semiconductor device having deep gate regions but the distance therebetween is narrow.
Figure 5B:
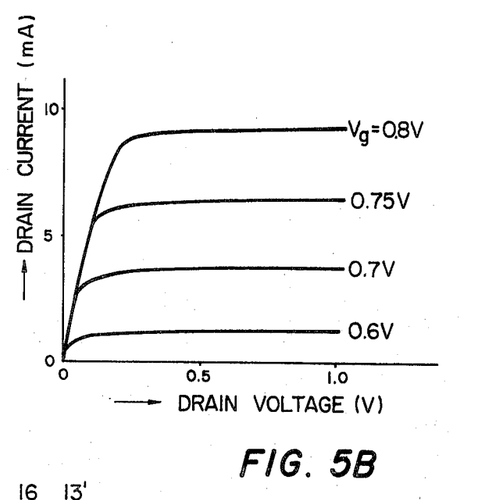
FIG. 5B is an I-V characteristic chart of the drain region in a structure shown in FIG. 5A.

In the case of FIG. 3A wherein the gate voltage $V_g$ is zero, essentially no injection of electrons from the source electrode 14 occurs, so that no current is allowed to flow. In other words, the transistor is in its cut-off state. When, under this condition, a positive voltage is applied to the gate electrode 13', holes will be injected from the gate region 13 into the channel region 12. In addition, these injected holes will flow into a high potential region as depicted in FIG. 3A, i.e. into the vicinity of the source electrode. The injected holes or the positive electric charge serve to lower the potential in the vicinity of the source electrode illustrated in the drawing. If a gate voltage $V_g$ is applied to such extent that the potential at the p+ type region 13 is substantially equal to the potential at the n type region 12, holes will be injected, in a substantial amount, to that portion in the channel located in the vicinity of the source electrode 14, so that the potential distribution in such instance will be expressed in the pattern as shown in FIG. 3B. Although the height $\phi_B$ of the potential barrier is substantially determined inherently, depending on the type of the metal and the semiconductor employed, the width W of the space charge region can vary depending upon the amount of holes that are injected. Accordingly, the width W can become very thin which, roughly speaking, is such as:

$$W = \left\{ \frac{2\epsilon(\phi_B - E_C + E_F)}{q(N_D + p)} \right\}^{\frac{1}{2}} \quad (2)$$

wherein: p represents hole concentration in the vicinity of the source electrode 14. Thus, injection of electrons will become enabled, by virtue of the tunnel effect, from the source electrode 14 toward the channel region 12. In other words, a drain current will be allowed to flow.

Where the distance between the adjacent gate regions 13 and 13 is large and these gate regions 13 and 13 are shallow, as shown in FIG. 4A, it should be understood that, if the drain voltage is raised to a certain extent, this elevated drain voltage will directly affect the potential distribution of that portion of the channel located close to the source electrode, and the drain current will depict a curve which gradually increases with an increase in the drain voltage as shown in FIG. 4B. On the other hand, where the gate regions 13 and 13 are deep and the distance therebetween is narrow as shown in FIG. 5A, the drain voltage will not directly affect the potential distribution of that portion of the channel located close to the source electrode, so that the I-V characteristic will almost exhibit a saturating characteristic as shown in FIG. 5B. It should be understood that as the gate voltage applied becomes deeper in the forward direction, the width W of the space charge region will become narrower, so that the amount of electrons which pass due to the tunnel effect will increase, causing the drain current to increase all the more. In the devices shown in FIGS. 4A and 5A, the source electrode is made of $TiSi_2$, the impurity concentration of the p+ type gate region is selected at about $1 \times 10^{19}$ cm$^{-3}$, the impurity concentration in the channel region is selected at about $1 \times 10^{15}$ cm$^{-3}$, and the source-to-drain distance is selected at about 2.5 μm. The depth of the p+ type gate region and the gate-to-gate distance are selected to be 0.8 μm and 1 μm, respectively, in these devices shown in FIG. 4A, whereas they are selected to be 2 μm and 1 μm, respectively, in FIG. 5A. In those transistors, the current gain of several hundreds can be easily obtained even at a high injection level.

Description will next be directed to the impurity concentration and the dimensions of the n type region 12. Not only the transition from the cut-off state to the conducting state, but also the transition from the conducting state to the cut-off state is required to be performed at a high speed. In the latter instance, however, those holes which have entered into that portion of the semiconductor region located near the foreground of the source electrode are required to be extracted quickly to the outside thereof. Since holes are not capable of flowing directly into the source electrode, they will become extinct due to recombination with the electrons contained in the metal. There are, of course, a number of those holes which become extinct in such process as described above. However, in addition to the extinguishment of holes, the extraction of the remaining holes from the afore-mentioned portion into the gate region 13 will serve to quicken the turn-off time. The turn-off time decreases with a decrease in the gate-to-gate distance (channel width). To this end, it is desirable that the space charge regions growing from the gate regions into the channel substantially reach the central portion of the channel. This is because of the fact that, in such state as mentioned above, a drift electric field for drifting holes toward the gate regions is produced, in a direction transverse of the direction of the channel. In order that the space charge regions extending from the gate regions may reach substantially the central portion of the channel at zero gate bias, i.e. at $V_g=0$, it is only necessary to arrange so that the impurity concentration of the n type silicon and the channel dimension have the relationship:

$$N_D \times (2a)^2 \lesssim 1 \times 10^8 \text{ cm}^{-1} \ldots \quad (3),$$

wherein: 2a represents the gate-to-gate distance (channel width). That is, if 2a=1 μm, $N_D$ is set at a value about $1 \times 10^{16}$ cm$^{-3}$ or less than that. If 2a=0.5 μm, $N_D$ is set at a value of about $4 \times 10^{16}$ cm$^{-3}$ or less than that.

Also, with respect to the p+ type gate regions 13, it is desirable that the impurity concentration of these p+ type gate regions 13 be selected at a value of at least $10^{18}$ cm$^{-3}$ or greater, since holes having a density of $10^{17}$ cm$^{-3}$ to $10^{18}$ cm$^{-3}$ or greater than that are injected into the n type region 12 which serves as the channel. More desirably, the impurity concentration of the gate regions 13 is $10^{19}$ cm$^{313}$ or greater. This is because of the consideration that injection of holes into the channel cannot take place in an amount greater than the amount of holes exsisting in the gate regions 13. The number of those holes which are injected must always be greater than the amount of electrons which are injected, by virtue of the tunnel effect, from the source electrode 14 which indeed is a Schottky emitter.

In order to elevate the operating speed, it is desirable that, at the turn-on time of the device, holes be injected quickly from the gate regions 13 to the foreground of the source electrode 14, and also that at the turn-off time, the holes be caused to return quickly into the gate regions 13. Therefore, the channel width 2a is usually designed to be small. For example, the length is 2 μm or smaller, or at a value of 1 μm or smaller. Needless to say, if the operating speed is not a matter of great concern, the channel width may have a greater value. If, however, the channel width 2a is excessively great, a sufficient amount of holes may not be injected to the foreground of the source electrode 14 due to the space charge effect of the injecting holes.

In order to provide a large current flow with as small an amount of holes as possible, it is desirable that the barrier height $\phi_B$ be as small as possible. The value of $\phi_B$ of various kinds of metals for silicon is, for example, as follows: about 0.5 V for Ti; about 0.7 V for Mo, W and Ni; and about 0.8 V for Pt. For such materials as Ga and As, $\phi_B$ is about 0.8 V for Al; about 0.88 V for Ag; and about 0.94 V for Pt. These values could vary depending on the manufacturing conditions. The distance between the gate region and the drain region is determined by the desired specification of the device. In order to enhance the breakdown voltage of the device, this distance is made longer. For a device which can have a low breakdown voltage, the distance may be small.

Figure 6:
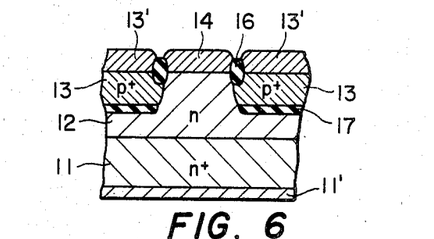
FIG. 6 is a diagrammatic sectional view of an embodiment of semiconductor device having a structure that an insulator layer under the gate regions is provided locally between the gate regions and the channel region.

The voltage across the source region and the drain region in the conducting state can be made sufficiently small. For example, in an instance where the semiconductor utilizes silicon, it should be noted that, if the gate voltage $V_g$ is set at about 0.8 V–0.9 V, the source-drain voltage will become about 0.1–0.2 V. If this is the case, the gate-drain will be deeply forward biased, so that a current will flow across the gate region and the drain region causing the gate-drain capacitance to increase, resulting in a degradation of both the current gain and the frequency characteristic of the device. In order to suppress such degradation, it is only necessary to provide an insulating layer 17 such as $SiO_2$ or $Si_3N_4$ between the gate region 13 and the n type region 12 in a manner as shown in FIG. 6. This insulating layer 17 may be formed by ion-implantation of either oxygen or nitrogen, followed by a heat treatment. Alternatively, the insulating layer 17 may be provided by forming an $SiO_2$ or $Si_3N_4$ layer into a desired pattern, and thereafter by performing an epitaxial growth thereon.

Figure 7:
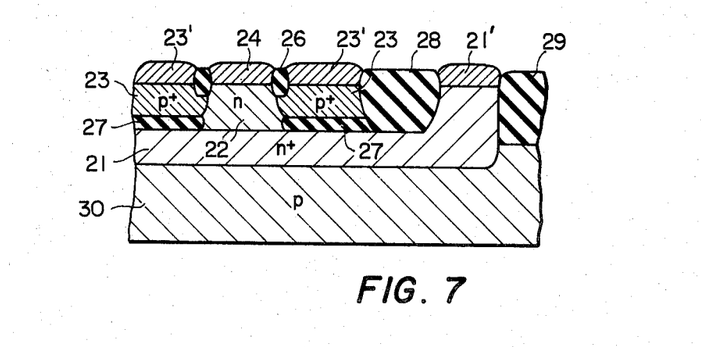
FIG. 7 is a diagrammatic sectional view of an embodiment of semiconductor device wherein the semiconductor device shown in FIG. 6 is of a planar structure.

Up to FIG. 6, discrete devices embodying the present invention are shown. It should be understood, however, that the transistor of the present invention is such that, because the source region (or the emitter region) thereof is in the form of a Schottky structure, a large current is allowed to flow even with a small channel area, whereby a high-speed operation is feasible. Also, because of the fact that the gate (or base) current is reduced so that a large current gain is obtained, a large fan-out can be taken. Thus, the transistor of the present invention is extremely suitable for application in integrated circuit. In FIG. 7 is shown a structure of the transistor according to the present invention which is constructed into a planar structure. A transistor of the present invention is formed on a p type substrate 30. Reference numerals 21, 22, 23, 24, 26, 27, 21' and 23' correspond to the $n^+$ type drain region 11, the n type channel region 12, the $p^+$ type gate region 13, the source electrode 14, the insulating layer 16, the insulating layer 17, the drain electrode 11' and the gate electrode 13', respectively. Reference numerals 28 and 29 represent insulating layers such as $SiO_2$.

Description has been made above with respect to instances wherein the impurity concentration of the n type region 12 or 22 which serves as the channel region is uniform. It should be understood here that the impurity concentration in this region may have a desired distribution of concentration. Such distribution may be provided either in the direction of the depth along the channel or in a direction normal to the direction of the channel in any desired pattern. In the cross-sectional direction of the channel, the impurity concentration must be gradually increased towards the channel center in order to realize a high-speed extraction of holes existing in the channel region. On the other hand, the impurity concentration in the channel must be increased towards the drain region in the source-to-drain direction in order to establish a built-in electric field from the drain region to the source region. In such arrangement, electrons are accelerated towards the drain region, and the holes are accelerated towards the source region.

Figure 8:
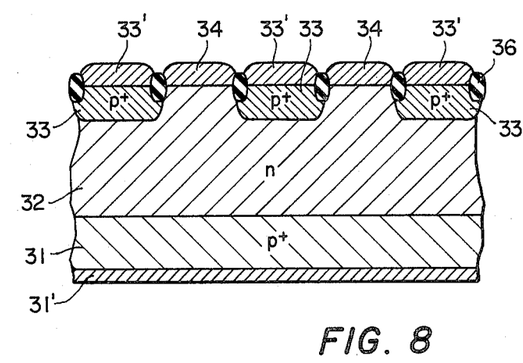
FIG. 8 is a diagrammatic sectional view of an embodiment of semiconductor deivce which is utilized as a thyristor.
Figure 9:
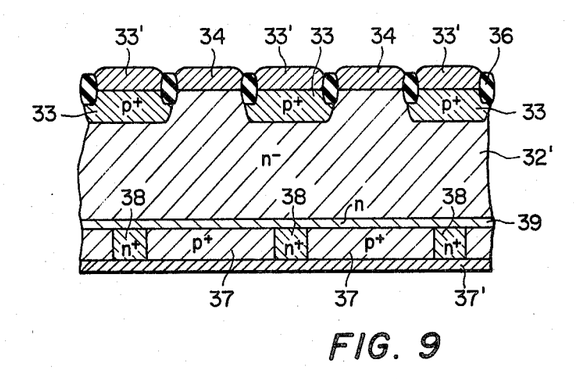
FIG. 9 is a diagrammatic sectional view of an embodiment of semiconductor device which is utilized as a thyristor having an anode-short structure.

Description has been made above with respect to transistors of the present invention. It should be obvious to those skilled in the art that there can be constructed a thyristor utilizing the same principle of the present invention. Such examples are shown in FIGS. 8 and 9. In FIG. 8, reference numeral 31 represents a $p^+$ type anode region, 31' an anode electrode, 32 an n type region, 33 a $p^+$ type gate region, 33' a gate electrode, 34 a cathode electrode, and 36 an insulating layer. In FIG. 9, the channel region is comprised of an $n^-$ type region 32' and the anode side is constructed in a mosaic pattern by a $p^+$ type region 37 and an $n^+$ type region 38, and a thin n type region 39 is provided in the foreground of the anode side, i.e. the anode-shorted structure. In these structures, the cathode is provided in the form of Schottky cathode structure. In the forward blocking state, it should be noted that because the $p^+$ type gate region 33 is under a zero gate bias or negative reverse gate bias, a potential barrier is produced in the channel, so that injection of electrons from the cathode side is inhibited. Also, the injection of holes from the anode side is inhibited due to the built-in potential at the $p^+n$ junction. The impurity concentration and the dimension of the channel region is selected so as to insure that, at the time of application of a maximum forward blocking voltage, the depletion layer growing from the $p^+$ type gate region 33 will not completely reach the $p^+$ type anode region 31 or 37. In the structure shown in FIG. 8, there is the drawback that, when a forward voltage is applied to the anode electorde 31', those electrons which are thermally generated in the depletion region will flow to the foreground of the anode region, thereby lowering the potential barrier produced in the foreground of the anode region, and thereby increasing leakage current. Such drawback is eliminated in the structure shown in FIG. 9. More particularly, those electrons which are produced in the $n^-$ type region 32' may flow to the foreground of the anode region, but they pass through the $n^+$ type region 38 and flow out through the electrode, so that the potential barrier formed in the foreground of the anode region is not lowered. In order to establish conduction, it is only necessary to apply a forward voltage to the $p^+$ type gate region 33. Whereby, electrons are injected from the cathode region so that they lower the potential barrier in the foreground of the anode region to cause an injection of holes from the anode region. In order to improve the speed of performance, the device according to the present invention is usually forced to operate at a low temperature such as 77° K. At a low temperature operation, carrier mobility increases several times larger than that at room temperature operation. At a low temperature operation, all of the doped impurities are not ionized in the semiconductor, particularly in silicon (Si) as compared to GaAs. In this specification, the terms "impurity concentration" are used so far, but, strictly and more reasonably speaking, these words "impurity concentration" should be replaced by "ionized impurity concentration".

Description has been made with respect to the transistors and thyristors employing the Schottky emitter or source of the present invention. It should be understood here that the semiconductor device according to the present invention is not limited to those structures illustrated. Any structure may be employed provided that holes are allowed to flow to the foreground of the emitter region to narrow the width of the potential barrier formed thereat to thereby cause electrons to be injected from the Schottky emitter into the channel by virtue of tunnel effect. For example, it is needless to say that the gate region may be provided on the side surfaces of a recessed region. In the structures illustrated here, the channel region is completely surrounded by the gate region. However, the channel region is not necessarily surrounded completely by the gate region. In some structures, some portion of the channel region is covered by an insulator region, and the remaining portions are covered by the gate region. Such Schottky structure may be provided by first applying a required semiconductor a metal layer which is capable of imparting a desired height of barrier, to such thickness from, for example, several 100 Å to about 2000 Å, and then applying continuously thereto a metal such as Al which is easy to process from the manufacturing point of view.

What is claimed is:

1. A semiconductor device, comprising:
a first lightly-doped semiconductor region of a first conductivity type and having a principal surface;
a second highly-doped semiconductor region of a second conductivity type opposite to said first conductivity type formed at said principal surface of said first semiconductor region to form a pn junction therewith and surrounding a portion of said first semiconductor region to define a current channel region therein:
a Schottky metal electrode connected to that part of said principal surface corresponding to said current channel region of said semiconductor region; and
a carrier-collecting highly-doped semiconductor region disposed adjacent to said first semiconductor region on that side of said first semiconductor region located opposite to said principal surface for extracting majority carriers injected from said Schottky metal electrode, through said channel region said second semiconductor region being responsive to forward bias signals applied thereto, said majority carriers injected from said Schottky metal electrode increasing with an increase of said forward bias voltage.

2. A semiconductor device according to claim 1, wherein said channel region has such impurity concentration and width as to insure that a portion of said channel region located in a foreground of said Schottky metal electrode is substantially covered by depletion layers growing into said channel region from said Schottky metal electrode.

3. A semiconductor device according to claim 2, wherein said channel impurity concentration (N) and said channel width (2a) are selected to satisfy: $N \times (2a)^{-2} \lesssim 1 \times 10^8 \text{ cm}^{-1}$.

4. A semiconductor device according to claim 2, wherein said channel region has a broad width (2a) and a low impurity concentration, and said second semiconductor region has a shallow depth into said first semiconductor region, and the potential distribution in said channel region is sensitive to the voltage of said carrier-collecting semiconductor region.

5. A semiconductor device according to claim 2, wherein said channel region has a small width and said second semiconductor region has a great depth into said first semiconductor region and the potential distribution in said channel region is substantially insensitive to the voltage of said carrier-collecting semiconductor region.

6. A semiconductor device according to claim 1, 2, 3, 4 or 5, wherein said second semiconductor region has an impurity concentration of at least $1 \times 10^{18} \text{ cm}^{-3}$.

7. A semiconductor device according to claim 1, 2, 3, 4 or 5 wherein said metal electrode is a metal selected from a group of metals consisting of Pt, Ti, Ta, W and Mo.

8. A semiconductor device according to claim 1, 2, 3, 4 or 5, wherein said Schottky metal electrode comprises a layer formed of a silicide of a metal selected from the group consisting of Pt, Ti, Ta, W, and Mo.

9. A semiconductor device according to claim 1, 2, 3, 4 or 5 further comprising:
an insulating layer formed between said second semiconductor region, and said carrier-collecting semiconductor region.

10. A semiconductor device according to claim 1, 2, 3, 4 or 5 wherein said first, second and carrier-collecting semiconductor regions are disposed at least partially coplanar to each other on said principal surface.

11. A semiconductor device according to claim 1, wherein said carrier-collecting semiconductor region is a third highly-doped semiconductor region having the same conductivity type as that of said second semiconductor region and an impurity concentration higher than that of said first semiconductor region.

12. A semiconductor device according to claim 1, wherein said carrier-collecting region includes alternately disposed first and second portions, said first portions having the same conductivity type as that of said second semiconductor region and an impurity concentration higher than that of said first semiconductor region, and said second portions having the same conductivity type as that of said first semiconductor region and an impurity concentration higher than that of said first semiconductor region, and a third portion disposed between said first and second portions and said first semiconductor region, said third portion comprising a thin fifth semiconductor region having the same conductivity type as that of said first semiconductor region and an impurity concentration higher than that of said first semiconductor region but lower than that of said carrier collecting region second portions.

13. A semiconductor device according to claim 1, 2, 3, 4 or 5, wherein said carrier-collecting region is a highly-doped semiconductor region having said first conductivity type.

14. A semiconductor device according to claim 6 wherein said carrier-collecting region is a highly-doped semiconductor region having said first conductivity type.

15. A semiconductor device according to claim 7 wherein said carrier-collecting region is a highly-doped semiconductor region having said first conductivity type.

16. A semiconductor device according to claim 8, wherein said carrier-collecting region is a highly-doped semiconductor region having said first conductivity type.

17. A semiconductor device according to claim 9, wherein said carrier-collecting region is a highly-doped semiconductor region having said first conductivity type.

18. A semiconductor device according to claim 10, wherein said carrier-collecting region is a highly-doped semiconductor region having said first conductivity type.

19. A semiconductor device according to claim 6, wherein said metal electrode is a metal selected from a group of metals consisting of Pt, Ti, Ta, W and Mo.

20. A semiconductor device according to claim 6, wherein said Schottky metal electrode comprises a layer formed for a silicide of a metal selected from the group consisting of Pt, Ti, Ta, W, and Mo.

21. A semiconductor device according to claim 6, further comprising:
an insulating layer formed between said second semiconductor region, and said carrier-collecting semicondutor region.

22. A semiconductor device according to claim 7, further comprising:
an insulating layer formed between said second semiconductor region, and said carrier-collecting semiconductor region.

23. A semiconductor device according to claim 8, further comprising:

an insulating layer formed between said second semiconductor region, and said carrier-collecting semiconductor region.

24. A semiconductor device according to claim 6, wherein said first, second and carrier-collecting semiconductor regions are disposed at least partially coplanar to each other on said principal surface.

25. A semiconductor device according to claim 7, wherein said first, second and carrier-collecting semiconductor regions are disposed at least partially coplanar to each other on said principal surface.

26. A semiconductor device according to claim 8, wherein said first, second and carrier-collecting semiconductor regions are disposed at least partially coplanar to each other on said principal surface.

27. A semiconductor device according to claim 9, wherein said first, second and carrier-collecting semiconductor regions are disposed at least partially coplanar to each other on said principal surface.

* * * * *